(12) United States Patent
Tamai

(10) Patent No.: US 6,300,675 B1
(45) Date of Patent: Oct. 9, 2001

(54) LOW-COST TAPE CARRIER PACKAGE AND LIQUID CRYSTAL MODULE USING THE SAME

(75) Inventor: Shigeki Tamai, Yoshino-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/495,301

(22) Filed: Feb. 1, 2000

(30) Foreign Application Priority Data

Feb. 2, 1999 (JP) .................................................. 11-025005

(51) Int. Cl.[7] .................................................. H01L 23/495
(52) U.S. Cl. ........................... 257/668; 257/692; 257/702
(58) Field of Search ................................... 257/668, 698, 257/700, 701, 702, 692

(56) References Cited

U.S. PATENT DOCUMENTS

| 5,917,149 | * | 6/1999 | Barclay et al. . |
| 6,191,471 | * | 2/2001 | Tamai et al. . |
| 6,208,521 | * | 3/2001 | Nakatsuka . |
| 6,225,688 | * | 5/2001 | Kim et al. . |
| 6,232,659 | * | 5/2001 | Clayton . |

FOREIGN PATENT DOCUMENTS

| 01019737 | 1/1989 | (JP) . |
| 6029352 | 2/1994 | (JP) . |

* cited by examiner

Primary Examiner—Sheila V. Clark
(74) Attorney, Agent, or Firm—Nixon & Vanderhye, P.C.

(57) ABSTRACT

The tape carrier package includes a base material, wiring lines formed on the base material, and an insulating top coat formed on the wiring lines to insulate and protect the wiring lines. The wiring lines have a plurality of line exposed portions and line exposed portions exposed from the insulating top coat. By bending the base material along a bending portion formed in the base material, line exposed portions and line exposed portions, which are resultantly opposed to each other, are electrically connected to each other, respectively. A three-dimensional interconnection structure can be realized by bending the base material. As a result, a tape carrier package of multilayer interconnection structure as well as a liquid crystal module using the tape carrier package are provided with low price.

6 Claims, 10 Drawing Sheets

LOW-COST TAPE CARRIER PACKAGE AND LIQUID CRYSTAL MODULE USING THE SAME

BACKGROUND OF THE INVENTION

The present invention relates to a tape carrier package for semiconductor devices and a liquid crystal module using the tape carrier package.

Conventionally, a liquid crystal driver comprising an IC or the like for driving a liquid crystal panel is, in many cases, mounted on a liquid crystal panel in the form of TCP (Tape Carrier Package), which is a form of package for semiconductor devices. FIG. 9 shows an example of such a liquid crystal panel module on which semiconductor devices are mounted.

As shown in FIG. 9, a liquid crystal panel 101 is connected to flexible boards 103, 104 by a plurality of TCPs 102, 102, . . . and each TCP 102 is equipped with a liquid crystal driver chip 105. The TCP 102 is supplied with power supply for driving the liquid crystal driver chips 105 as well as various control signals from the flexible boards 103, 104, and supplies the liquid crystal panel 101 with a voltage for driving the liquid crystal panel 101.

Next, FIG. 10 shows an example of the conventional TCP. As shown in FIG. 10, the TCP has output-side lines 201 and input-side lines 202. These output-side lines 201 and input-side lines 202 are formed on a base material 203. This base material 203 has a device hole 205 formed generally in the center. This device hole 205 makes exposed inner end portions 201A of the output-side lines 201 and inner end portions 202A of the input-side lines 202. Then, a semiconductor chip (not shown) is mounted onto this device hole 205, and bump electrodes of this semiconductor chip are connected to the inner end portions 201A of the output-side lines 201 and the inner end portions 202A of the input-side lines 202. Also, outer end portions 201B of the output-side lines 201 are connected to the liquid crystal panel. Outer end portions 202B of the input-side lines 202, on the other hand, are exposed by an input connection slit 207 formed in the base material 203, and these outer end portions 202B are connected to the wiring on the flexible board. Through this wiring on the flexible board, the TCP performs exchange of power supply for driving the liquid crystal panel, power supply for driving semiconductor, and various control signals.

In this connection, in recent years, because of the demands for lighter, thinner, shorter and smaller products from the market, downsizing is indispensable also for semiconductor devices to be mounted on a liquid crystal panel. As a response to such a demand, there has been proposed a technique for multilayer interconnection for TCPs. In this regard, for example, Japanese Patent Laid-Open Publications SHO 64-19737 and HEI 6-29352 can be mentioned.

That is, currently, a flexible board equipped with liquid crystal panel driving power supply, semiconductor device driving power supply and various control signal lines leading to semiconductor devices is provided as a multilayer board of, for example, five layers. Therefore, by forming the TCP, which is to be connected to the flexible board, into a multilayer interconnection structure, the flexible board can be reduced in wiring burden and, as a result, downsized.

Further, forming the TCP into a multilayer interconnection structure increases the degree of freedom of wiring, so that even when replacement of a liquid crystal driving semiconductor device with a new liquid crystal driving semiconductor device having a different form of input terminals is involved, the flexible board can be commonized by changing the interconnections within the TCP. Thus, a cost reduction can be achieved.

Still further, whereas the liquid crystal panel driving power supply to be fed to the liquid crystal driving semiconductor device is fed to the semiconductor device generally via a plurality of bumps (pads), supply lines for this power supply, when implemented by multilayer interconnection on the TCP, make it possible to lower the resistance, to prevent voltage drops, and to increase the noise immunity.

However, as compared with the monolayer interconnection TCP, the multilayer interconnection TCP decreases in throughput as the man-hours of manufacturing processes or the complexity increases, and moreover the material itself increases. As a result of this, the cost per unit area of the TCP becomes at least a double or more. On these accounts, the multilayer interconnection TCP has been kept from positive adoption, as it stands.

However, recent years' trends toward lighter, thinner, shorter and smaller products as well as toward reduction in cost could not be met when the TCP on which semiconductor devices are mounted is discussed singly. That is, there is a need for comprehensive discussions that are directed also to flexible boards to be connected to the TCP, while there is a strong demand for multilayer interconnections of TCPs.

Therefore, an object of the present invention is to provide a low-cost tape carrier package of multilayer interconnection structure as well as a liquid crystal module using the tape carrier package.

In order to achieve the above object, there is provided a tape carrier package on which a semiconductor device is to be mounted, comprising:

a base material 3; wiring lines 7, 15 formed on the base material 3; and an insulating top coat 35 for insulating and protecting the wiring lines, wherein the wiring lines 7, 15 have a plurality of line exposed portions A–J, a–j exposed from the insulating top coat 35, and at least one pair of line exposed portions A, a . . . , which are opposed to each other by bending the base material 3 along a bending portion 11 formed in the base material 3, are electrically connected to each other.

In this constitution of the invention, the base material is bent along the bending portion, by which opposed line exposed portions are electrically connected to each other. As a result, a two-layer interconnection structure of three-dimensional interconnection can be realized. This three-dimensional interconnection structure can be achieved by bending the base material, and therefore low in cost.

In an embodiment of the present invention, the one pair of line exposed portions A, a are electrically connected to each other by an anisotropic conductive film 37.

In this embodiment of the invention, line exposed portions of upper-layer interconnections and line exposed portions of lower-layer interconnections can be electrically connected to each other by an anisotropic conductive film.

In an embodiment of the present invention, bending alignment marks 17, 18 used in bending the base material 3 are formed in the base material 3.

In this embodiment of the invention, the base material can be bent so that a pair of line exposed portions that should be electrically connected to each other are accurately opposed to each other, with the use of the bending alignment marks.

In an embodiment of the present invention, the bending portion 42, 43 is provided so that, relative to main lines 7 connected directly to the semiconductor device, the bending portion 42, 43 extends in adjacency to a direction in which the main lines 7 are arrayed and along a direction in which the main lines 7 extend.

In this embodiment of the invention, since the bending portion is in adjacency to the direction in which the main lines are arrayed, the size in the direction in which the main lines extend before bending at the bending portion can be reduced, as compared with the case in which the bending portion is adjacent to the direction in which the main lines extend.

In an embodiment of the present invention, an input-connection slit 10 by which the main lines 7 connected directly to the semiconductor device are exposed are formed in the base material 3, and an input-connection hole 12 which is to be laid on the input-connection slit 10 when the base material 3 is bent 180° along the bending portion 11 is formed in the base material 3.

In this embodiment of the invention, even after the tape carrier package has been bent, the main lines remain exposed upward and downward at the input-connection hole and the input-connection slit. Therefore, even after the bending, the exposed portions of the main lines can be connected to the flexible board from both above and below.

Also, there is provided a liquid crystal module which uses the tape carrier package as mentioned above.

This liquid crystal module of the invention employs a low-cost tape carrier package having a three-dimensional interconnection structure. Therefore, the liquid crystal module can be downsized and reduced in cost.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the present invention is described in detail with reference to embodiments thereof illustrated in the accompanying drawings.

(First Embodiment)

Figure 1:
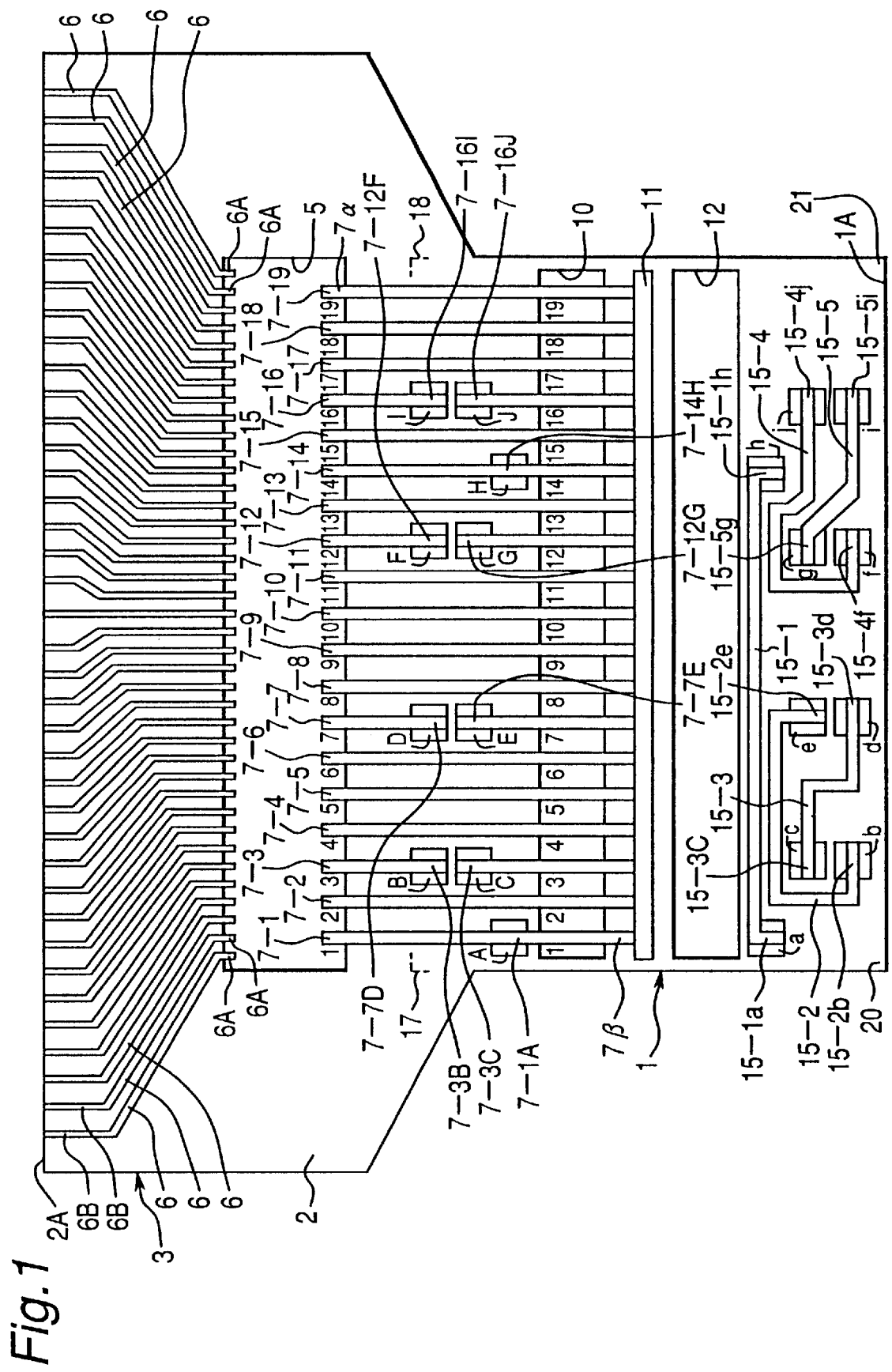
FIG. 1 shows a first embodiment of the tape carrier package according to the present invention.

FIG. 1 shows a TCP (Tape Carrier Package) for liquid-crystal driving semiconductor devices as a first embodiment of the present invention. As shown in FIG. 1, this TCP of the first embodiment has a base material 3 comprising a base portion 1 and a wider portion 2 broadened laterally wider than the base portion 1. A sideways long, rectangular device hole 5 is formed generally in the center of the wider portion 2 of this base material 3.

A semiconductor device (not shown) is to be mounted on this device hole 5. A plurality of output-side lines 6, 6, 6 . . . ranging from this device hole 5 to an end 2A of the wider portion 2 are placed on the wider portion 2. This plurality of output-side lines 6, 6, 6 . . . are arranged sideways with specified intervals, and one ends 6A, 6A, 6A . . . being projected into the device hole 5. The other ends 6B, 6B, 6B . . . of the output-side lines 6, 6, 6 . . . are connected to ITO (indium tin oxide) of the source bus line or gate bus line of the liquid crystal panel.

Meanwhile, input-side main lines 7, 7, 7 . . . extending from this device hole 5 toward an end 1A of the base portion 1 are arranged on the base material 3 over a range from the wider portion 2 to the base portion 1. Also, the base portion 1 has an input-connection slit 10, a bending slit 11 and an input-connection hole 12. These input-connection slit 10, bending slit 11 and input-connection hole 12 are arrayed in order from the device hole 5 toward the end 1A of the base portion 1. Then, the input-side main lines 7 have one ends 7α projecting into the device hole 5, and the other ends 7β reaching just before the bending slit 11.

These input-side main lines 7 are connected to a flexible board by means of the input-connection slit 10 so that power supply and various control signals are inputted from this flexible board.

The input-side main lines 7 are arrayed sideways to a line count of nineteen. These nineteen input-side main lines 7 are, although not shown in FIG. 1, covered with solder resist serving as an insulating top coat.

Then, the leftmost line 7-1 in the figure has a line exposed portion 7-1A exposed from the solder resist at a solder-resist uncoated portion A positioned just before the input-connection slit 10. Also, the third line 7-3 is cut off at a point between the device hole 5 and the input-connection slit 10, and both ends 7-3B and 7-3C of this cutoff are exposed at solder-resist uncoated portions B and C, forming line exposed portions 7-3B and 7-3C. The seventh line 7-7 is also cut off at a point between the device hole 5 and the input-connection slit 10, and both ends 7-7D and 7-7E of this cutoff are exposed at solder-resist uncoated portions D and E, forming line exposed portions 7-7D and 7-7E. The twelfth line 7-12 is also cut off at a point between the device hole 5 and the input-connection slit 10, and both ends 7-12F and 7-12G of this cutoff are exposed at solder-resist uncoated portions F and G, forming line exposed portions 7-12F and 7-12G. The fourteenth line 7-14 has a line exposed portion 7-14H exposed from the solder resist at a solder-resist uncoated portion H just before the input-connection slit 10. The sixteenth line 7-16 is cut off at a point between the device hole 5 and the input-connection slit 10, and both ends 7-16I and 7-16J of this cutoff are exposed at solder-resist uncoated portions I and J, forming line exposed portions 7-16I and 7-16J. The other lines 7-2, 7-4, 7-5, 7-6, 7-8, 7-9, 7-10, 7-11, 7-13, 7-15, 7-17, 7-18 and 7-19 extend from the one ends 7α to the other ends 7β without being cut off and without being exposed.

Also, input-side sub-lines 15 are placed in a region between the input-connection hole 12 of the base portion 1 of the base material 3 and the end 1A of the base portion 1. These input-side sub-lines 15 are also covered with the solder resist serving as an insulating top coat, as in the input-side main lines 7.

These input-side sub-lines 15 comprise five sub-lines of sub-line 15-1 to sub-line 15-5. The sub-line 15-1 extends generally parallel to the bending slit 11, and has an exposed portion 15-1a and an exposed portion 15-1h at both ends. These exposed portions 15-1a and 15-1h are exposed at solder-resist uncoated portions a, h, corresponding to the main-line exposed portions 7-1A, 7-14H. Also, the sub-line 15-2 has an exposed portion 15-2b and an exposed portion 15-2e at both ends, where the exposed portion 15-2b corresponds to the main-line exposed portion 7-3B and the exposed portion 15-2e corresponds to the main-line exposed portion 7-7E. The sub-line 15-3 has an exposed portion 15-3c and an exposed portion 15-3d at both ends, where the exposed portion 15-3c corresponds to the main-line exposed portion 7-3C and the exposed portion 15-3d corresponds to the main-line exposed portion 7-7D. The sub-line 15-4 has an exposed portion 15-4f and an exposed portion 15-4j at both ends, where the exposed portion 15-4f corresponds to the main-line exposed portion 7-12F and the exposed portion 15-4j corresponds to the main-line exposed portion 7-16J. The sub-line 15-5 has an exposed portion 15-5g and an exposed portion 15-5i at both ends, where the exposed portion 15-5g corresponds to the main-line exposed portion 7-12G and the exposed portion 15-5i corresponds to the main-line exposed portion 7-16I.

The solder-resist uncoated portions A, B, C, D, E, F, G, H, I, J and the solder-resist uncoated portions a, b, c, d, e, f, g, h, i, j are coated with an anisotropic conductive film (not shown).

Also, alignment marks 17, 18 of bracket shape are formed in the wider portion 2 between the base portion 1 and the device hole 5. These alignment marks 17, 18 are marks for aligning corners 20, 21 of the base portion 1 when the base portion 1 is bent at the bending slit 11. These alignment marks 17, 18 may be patterned simultaneously when, for example, the main-, sub-lines made of copper (Cu) are patterned.

Then, by bending the base portion 1 approximately 180° along the bending slit 11, the exposed portions 15-1a, 15-2b, 15-3c, 15-3d, 15-2e of the sub-lines 15 are laid on the exposed portions 7-1A, 7-3B, 7-3C, 7-7D, 7-7E of the main lines 7, respectively, and through thermocompression bonding, are electrically connected together by the anisotropic conductive film. At the same time, the exposed portions 15-4f, 15-5g, 15-1h, 15-5i, 15-4j of the sub-lines 15 are laid on the exposed portions 7-12F, 7-12G, 7-14H, 7-16I, 7-16J of the main lines, respectively, and through thermocompression bonding, are electrically connected together by the anisotropic conductive film.

As a result, a two-layer interconnection structure of three-dimensional interconnection can be realized. This three-dimensional interconnection structure can be realized by bending the base material 3, and so low in cost.

Also, by using the alignment marks 17, 18, the exposed portions 7-1A, 7-3B, . . . of the main lines 7 and the exposed portions 15-1a, 15-2b, . . . of the sub-lines can be connected together so as to be accurately opposed to each other when the base portion 1 is bent at the bending slit 11.

(Second Embodiment)

Figure 2:
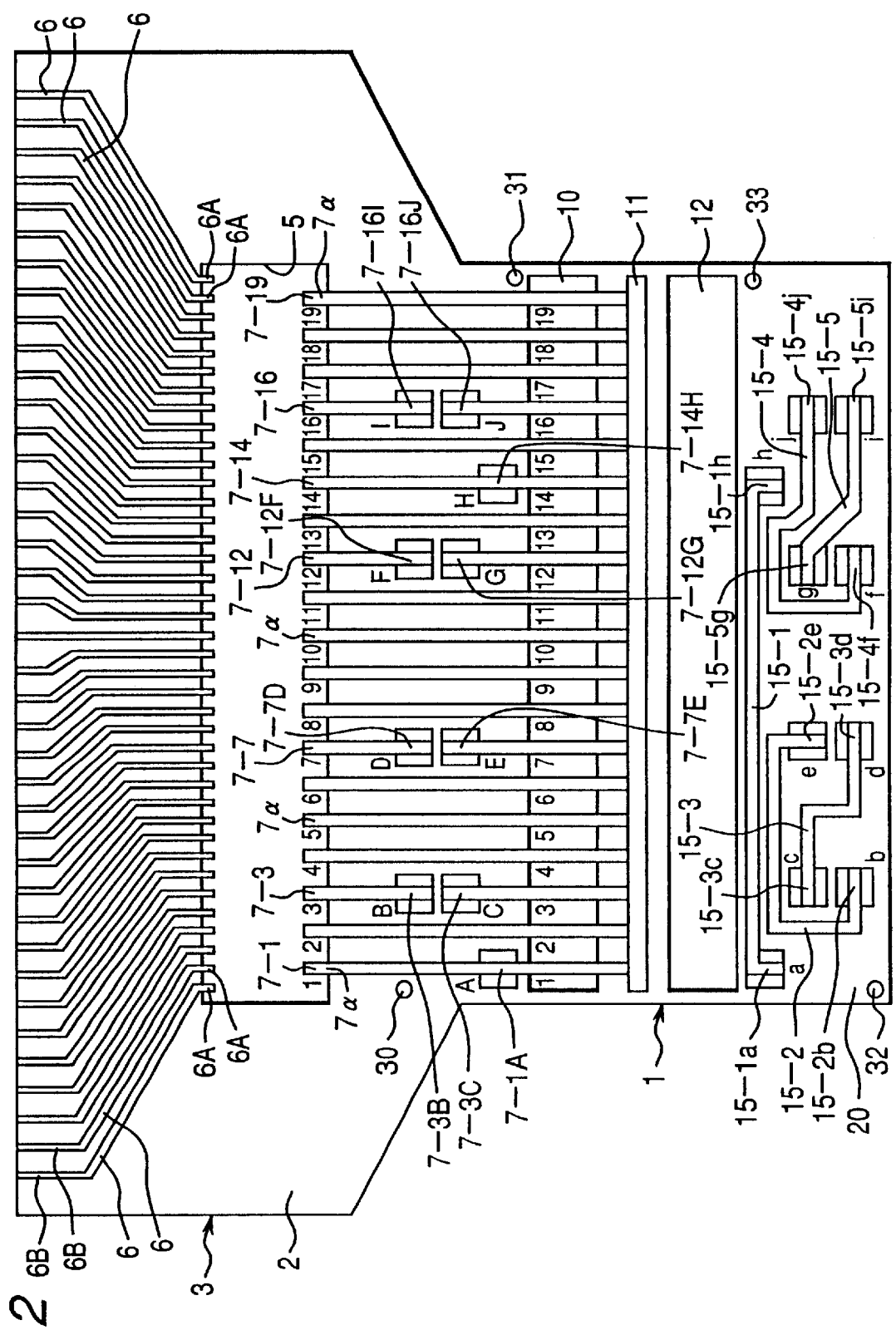
FIG. 2 shows a second embodiment of the tape carrier package according to the present invention.

Next, FIG. 2 shows a tape carrier package for liquid-crystal driving semiconductor devices as a second embodiment of the TCP of the present invention. This second embodiment differs from the foregoing first embodiment only in that alignment holes 30, 31 and 32, 33 are provided instead of the alignment marks 17, 18.

As shown in FIG. 2, an alignment hole 30 is formed beside the main-line 7-1, and an alignment hole 32 is formed at a corner 20 of the base portion 1. Also, an alignment hole 31 is formed beside the main line 7-19, and an alignment hole 33 is formed beside the input-connection hole 12 of the base portion 1. When the base portion 1 is bent along the bending slit 11, the alignment holes 30 and 32 are laid on each other, and the alignment holes 31 and 33 are laid on each other, by which the exposed portions 7-1A, 7-3B, . . . of the main lines 7 and the exposed portions 15-1a, 15-2b, . . . of the sub-lines can be connected so as to be accurately opposed to each other.

According to this second embodiment, two sets of alignment holes 30, 32 and 31, 33 are provided at symmetrical positions with respect to the bending slit 11, and alignment is done by using these two sets of alignment holes. Therefore, a more accurate alignment can be achieved as compared with the first embodiment.

Figure 7:
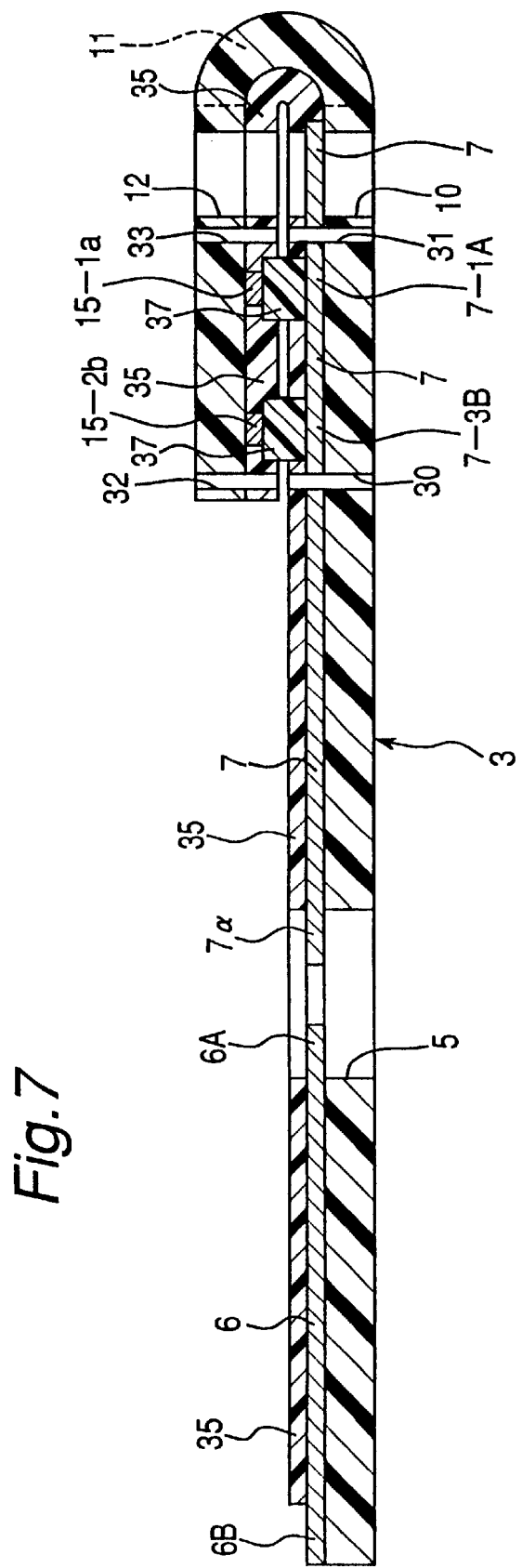
FIG. 7 is a sectional view after the 180 degree bending in the second embodiment.

FIG. 7 shows a cross section of the second embodiment in a state that the base portion is bent 180° at the bending slit 11. The other ends 6B of the output-side lines 6 are, although not shown, electrically connected to the ITO of the liquid crystal panel by thermocompression bonding via an anisotropic conductive film. Then, although not shown, a semiconductor chip is mounted on the device hole 5, and bump electrodes (pads) of this semiconductor chip are electrically connected to one ends 7α of the input-side main lines 7 and one ends 6A of the output-side lines 6.

As shown in FIG. 7, solder resist 35 is not applied onto the one ends 6A and the other ends 6B of the output-side lines 6, nor onto the one ends 7α of the input-side main lines 7. Also, the solder resist 35 is not applied onto the input-side main lines 7 within the input-connection slit 10 where the base material 3 is opened.

The input-connection slit 10 is an opening for connecting the input-side main lines 7 to the flexible board. These input-side main lines 7 and the flexible board are electrically connected to each other by using, for example, solder or the like. Also, the input-connection hole 12 is an opening for connecting the input-side main lines 7 to the flexible board, like the input-connection slit 10. The presence of this input-connection hole 12 makes it possible to connect the input-side main lines 7 to the flexible board from both the connection hole 12 side and the slit 10 side. As a result, the degree of freedom of connection increases, so that the tape carrier package can be accommodated compactly in the space of the picture frame of the liquid crystal panel or the like, for example, while kept connected to the liquid crystal panel and the flexible board.

As shown in FIG. 7, in the state that the tape carrier package is bent 180° at the bending slit 11, the alignment holes 30 and 32 are laid on each other while the alignment holes 31 and 33 are laid on each other. As a result, for example, the solder-resist uncoated portions A and a are opposed to each other, and by performing thermocompression bonding, a successful electrical connection between the exposed portion 7-1A of the main lines 7 and the exposed portion 15-1a of the sub-lines can be achieved by electrically conductive particles within the anisotropic conductive film 37 between these solder-resist uncoated portions A and a. It is noted that as the conditions for this thermocompression bonding, heating temperature is preferably 100–250° C. and applied pressure is preferably 10–60 Kgf/cm$^2$.

In addition, the anisotropic conductive film is a film made of an anisotropic electrically conductive material which is so constituted that electrically conductive particles of nickel or gold or the like are dispersed in an adhesive material such as phenol resin or polysulfone resin.

Figure 8:
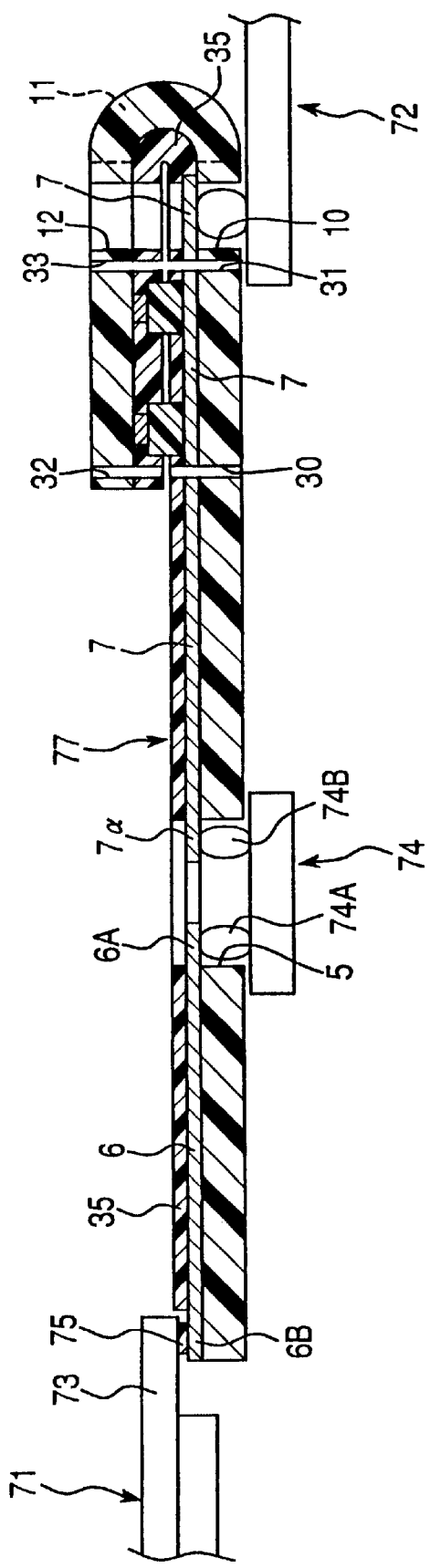
FIG. 8 is a sectional view of a liquid crystal module equipped with the tape carrier package of the second embodiment.
Figure 9:
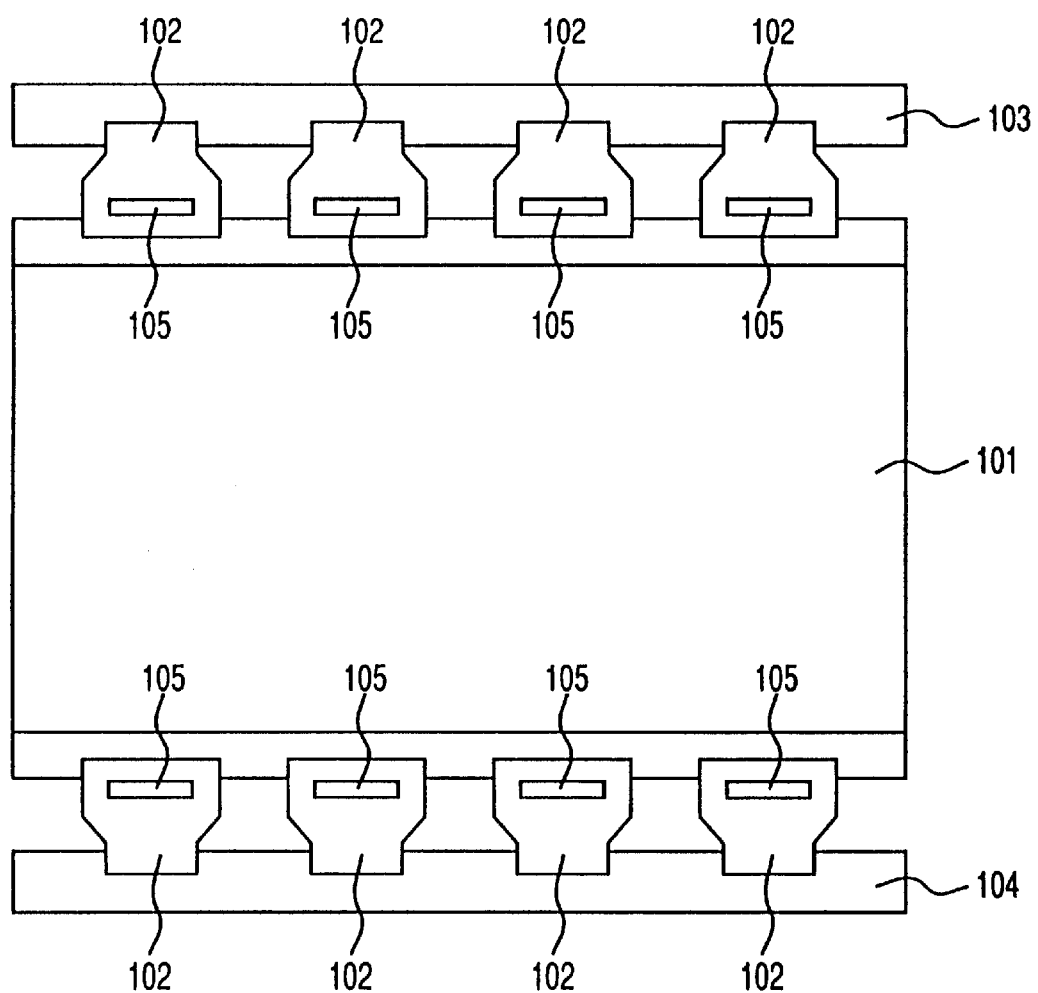
FIG. 9 is a plan view of a liquid crystal panel equipped with a tape carrier package according to the prior art.
Figure 10:
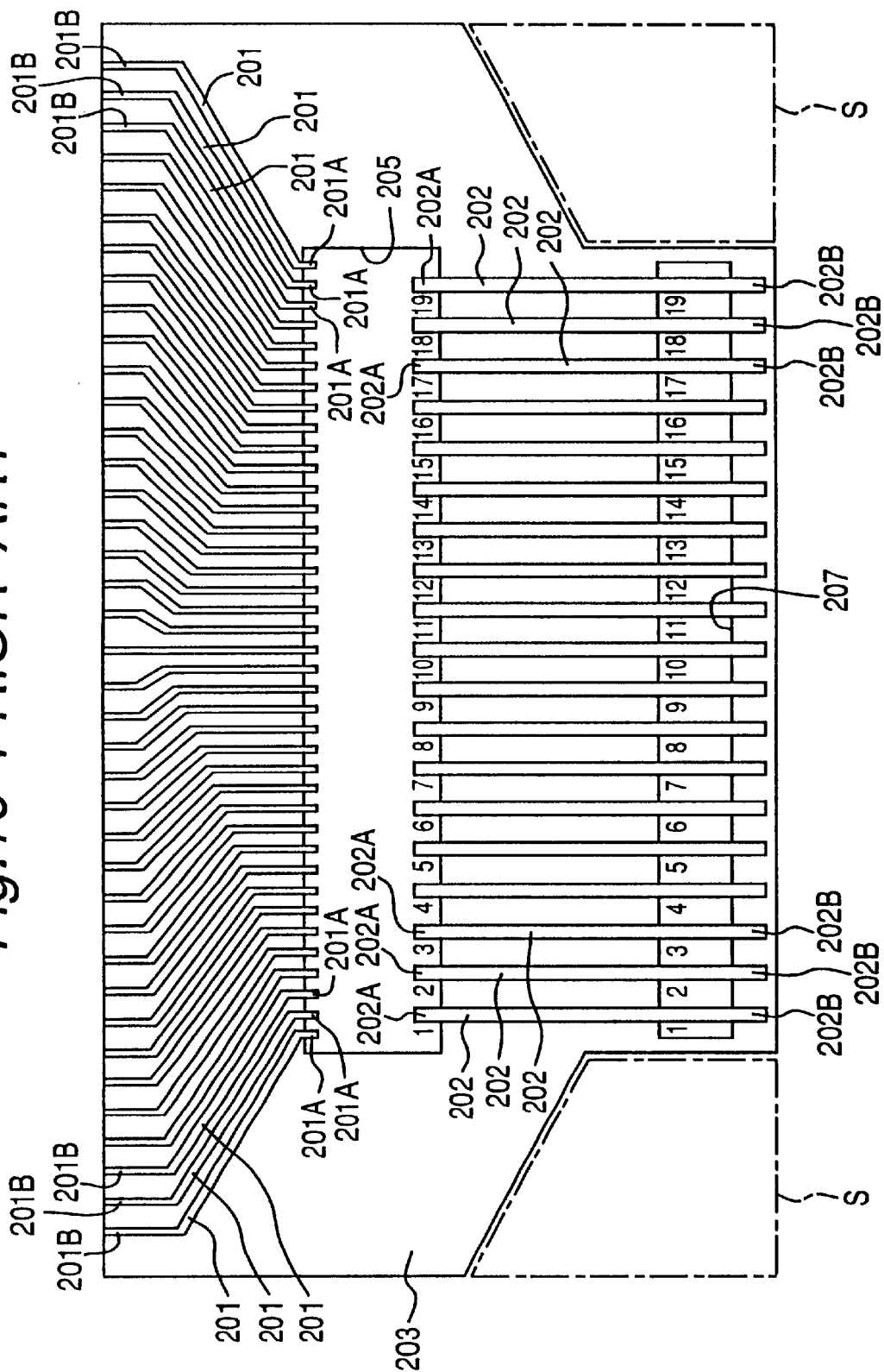
FIG. 10 is a plan view of the tape carrier package according to the prior art.

FIG. 8 shows a liquid crystal module equipped with a tape carrier package 77 of this second embodiment. This liquid crystal module comprises a liquid crystal panel 71, the tape carrier package 77, a liquid-crystal driving semiconductor chip 74 and a flexible board 72. A transparent electrode 73 of the liquid crystal panel 71 is connected to the other ends 6B of the output-side lines 6 of the tape carrier package 77 with an anisotropic conductive film 75. Also, a bump electrode 74A of the semiconductor chip 74 is connected to the one ends 6A of the output-side lines 6, and a bump electrode 74B of the semiconductor chip 74 is connected to the one ends 7α of the input-side main lines 7. Further, these input-side main lines 7 are exposed from the solder resist 35 at the input-connection slit 10, and electrically connected to the flexible board 72 by solder or the like. According to the liquid crystal module shown in FIG. 10, since the low-cost tape carrier package 77 having a three-dimensional interconnection structure is used, the tape carrier package can be reduced in size and cost.

(Third Embodiment)

Figure 3:
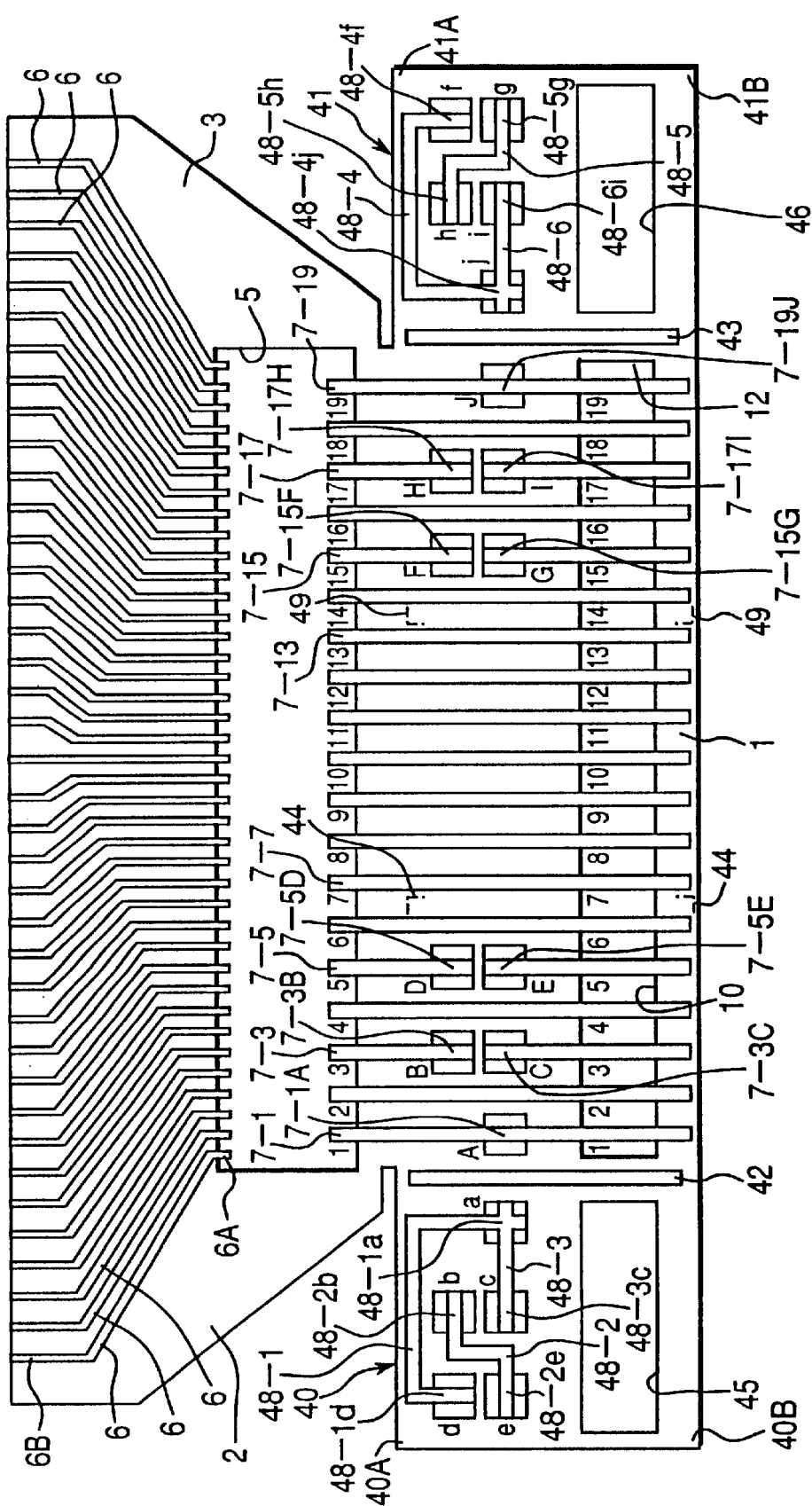
FIG. 3 shows a third embodiment of the tape carrier package according to the present invention.

Next, FIG. 3 shows a tape carrier package for liquid-crystal driving semiconductor devices as a third embodiment of the present invention.

This third embodiment differs from the foregoing first embodiment in that the tape carrier package has rectangular-shaped base-portion juts 40, 41 in adjacency to both sides of a direction in which the input-side main lines 7 are arrayed, while a portion ranging from the bending slit 11 to the end 1A of the base portion 1 is omitted. These base-portion juts 40, 41 have, at the border with the base portion 1, bending slits 42, 43 extending along the direction in which the main lines 7 extend. Further, the base-portion juts 40, 41 have input-connection holes 45, 46 extending in the direction in which the input-connection slit 10 extends.

This third embodiment further differs from the foregoing first embodiment in the structure of the input-side main lines 7. That is, in this third embodiment, the main line 7-5 is cut off and the main line 7-7 is not cut off. Then, both ends 7-5D, 7-SE of this cutoff are exposed at the solder-resist uncoated portions D, E, thus forming line exposed portions 7-5D, 7-5E. Also in this third embodiment, the main lines 7-15 and the main line 7-17 are cut off, and both ends 7-15F, 7-15G and 7-17H, 7-17I of these cutoffs are exposed at the solder-resist uncoated portions F, G and H, I, thus forming line exposed portions 7-15F, 7-15G and 7-17H, 7-17I. Also, the main line 7-19 is exposed at a solder-resist uncoated portion J, forming a line exposed portion 7-19J. The solder-resist uncoated portions A–E, F–J are coated with an anisotropic conductive film. Further, an alignment mark 44 of bracket shape is formed between the main lines 7-6 and 7-7, and an alignment mark 49 of bracket shape is formed between the main lines 7-13 and 7-14.

Then, in this third embodiment, sub-lines 48-1, 48-2, 48-3 are formed in the base-portion jut 40, and sub-lines 48-4, 48-5, 48-6 are formed in the base-portion jut 41. The sub-line 48-1 is exposed at solder-resist uncoated portions a, d at both ends, forming line exposed portions 48-1a, 48-1d. Further, the sub-line 48-3 is formed from the line exposed portion 48-1a, and the other end is exposed at the solder-resist uncoated portion c, forming a line exposed portion 48-3c. The sub-line 48-2 is exposed at solder-resist uncoated portions b, e at both ends, forming line exposed portions 48-2b, 48-2e. The sub-line 48-4 is exposed at solder-resist uncoated portions f, j at both ends, forming line exposed portions 48-4f, 48-4j. Further, the sub-line 48-6 is formed from the line exposed portion 48-4j, and the other end is exposed at the solder-resist uncoated portion i, forming a line exposed portion 48-6i. The sub-line 48-5 is exposed at solder-resist uncoated portions g, h at both ends, forming line exposed portions 48-5g, 48-5h. These solder-resist uncoated portions a–e, f–j are coated with an anisotropic conductive film (not shown).

Then, the base-portion jut 40 is bent 180° at the bending slit 42 toward the base portion 1, so that corners 40A, 40B of the base-portion jut 40 are laid on the alignment marks 44, 44 of the base portion 1. As a result, the line exposed portions 48-1a, 48-2b, 48-3c, 48-1d, 48-2e can be accurately laid on, and thermocompression bonded with, the line exposed portions 7-1A, 7-3B, 7-3C, 7-5D, 7-5E. Thus, the line exposed portions 7-1A to 7-5E and the line exposed portions 48-1a to 48-2e can be electrically connected to each other by the anisotropic conductive film.

Also, the base-portion jut 41 is bent 180° at the bending slit 43 toward the base portion 1, so that corners 41A, 41B of the base-portion jut 41 are laid on the alignment marks 49, 49 of the base portion 1. As a result, the line exposed portions 48-4f, 48-5g, 48-5h, 48-6i, 48-4j can be accurately laid on, and thermocompression bonded with, the line exposed portions 7-15F, 7-15G, 7-17H, 7-17I, 7-19J. Thus, the line exposed portions 7-15F to 7-19J and the line exposed portions 48-4f to 48-4j can be electrically connected to each other by the anisotropic conductive film.

As shown above, according to this third embodiment, since the base-portion juts 40, 41 for forming a two-layer interconnection structure are provided in adjacency to the direction in which the main lines 7 are arrayed, the before-bending size of the tape carrier package in the direction in which the main lines extend can be reduced, and therefore compacted, as compared with the first and second embodiments.

In addition, as shown also in FIGS. 1 to 3, for the tape carrier package for liquid-crystal driving semiconductor devices, normally, it is necessary to widen the pitch of the output-side lines 6, 6, 6 . . . with a view to connecting to the liquid crystal panel. Meanwhile, the input-side lines 7, 7, 7 . . . are led out generally straight because of their small number of lines relative to the number of the output-side lines. Accordingly, in the process of punching out the base material 3 of the tape carrier package for liquid-crystal driving semiconductor devices, the base portion 1 becomes narrower in width in a region where the input-side lines 7 are formed, than in another region of the output-side lines. This third embodiment makes effective use of a part that is beside the narrower-in-width side portion of the base portion 1 and that would be punched out as unnecessary part (space S in FIG. 10).

Therefore, according to this third embodiment, the tape length of the tape carrier package can be reduced, and therefore reduced in cost, as compared with the first and second embodiments.

(Fourth Embodiment)

Figure 4:
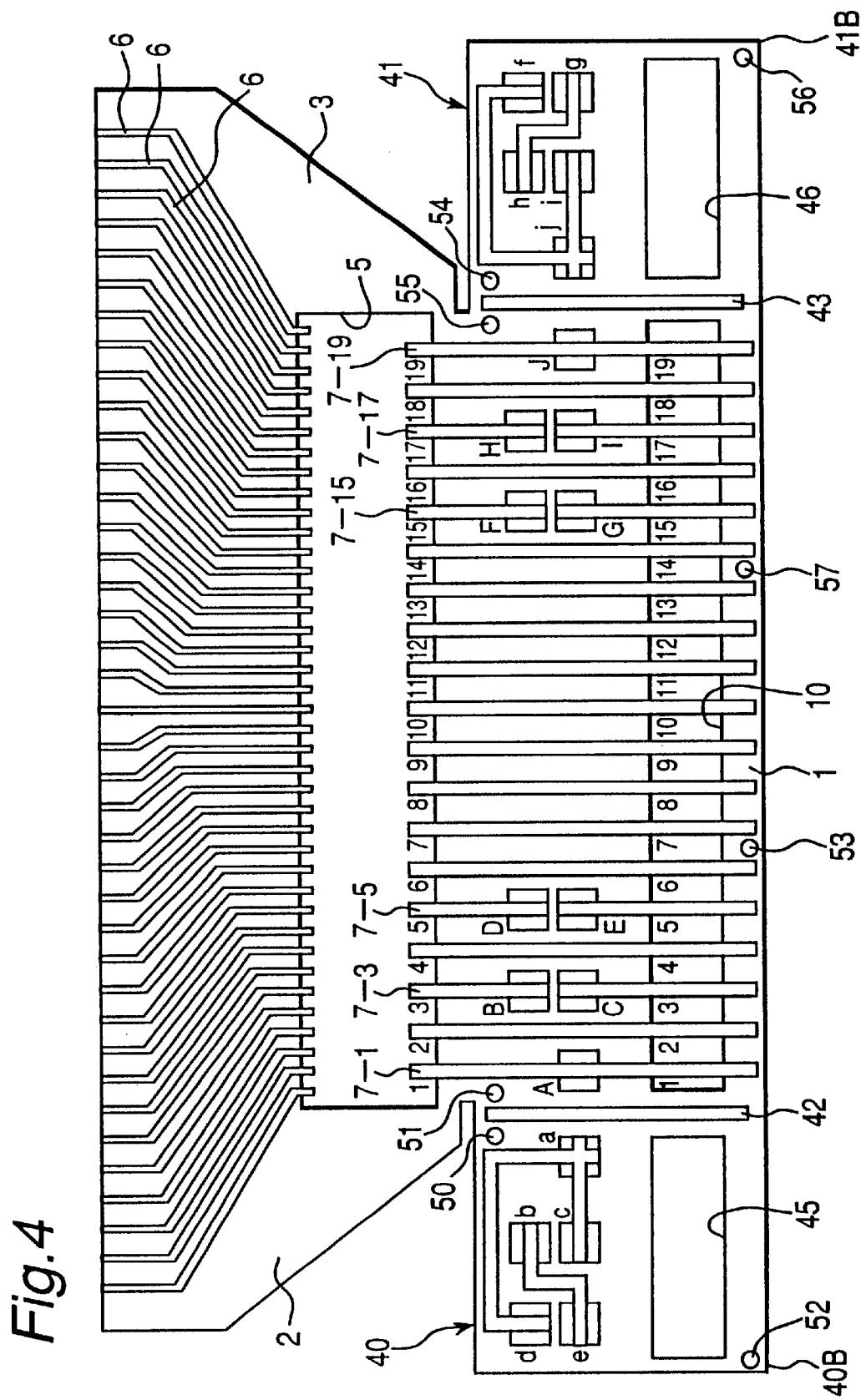
FIG. 4 shows a fourth embodiment of the tape carrier package according to the present invention.

Next, FIG. 4 shows a tape carrier package for liquid-crystal driving semiconductor devices, which is a fourth embodiment of the present invention.

This fourth embodiment differs from the foregoing third embodiment only in that four sets of alignment holes 50, 51, 52, 53, 54, 55, 56, 57 are formed in the base material 3 instead of the alignment marks 44, 49.

The alignment holes 50, 51 are placed in proximity to the jut portion 40 and the base portion 1 with the bending slit 42 interposed between the alignment holes 50, 51. Also, the alignment holes 52, 53 are placed away from the corner 40B of the jut portion 40 and the base portion 1 with the bending slit 42 interposed between the alignment holes 52, 53. The alignment holes 54, 55 are placed in proximity to the jut portion 41 and the base portion 1 with the bending slit 43 not interposed between the alignment holes 54, 55. Further, the alignment holes 56, 57 are placed away from the corner 41B of the jut portion 41 and the base portion 1 with the bending slit 43 interposed between the alignment holes 56, 57.

According to this fourth embodiment, the jut portion 40 can be accurately aligned to the bending position by means of the two sets of alignment holes 50, 51 and 52, 53 by bending at the bending slit 42. Also, the jut portion 41 can be accurately aligned to the bending position by means of the two sets of alignment holes 54, 55 and 56, 57 by bending at the bending slit 43. Therefore, according to this fourth embodiment, an even more accurate alignment in bending process can be achieved, as compared with the third embodiment.

(Fifth Embodiment)

Figure 5:
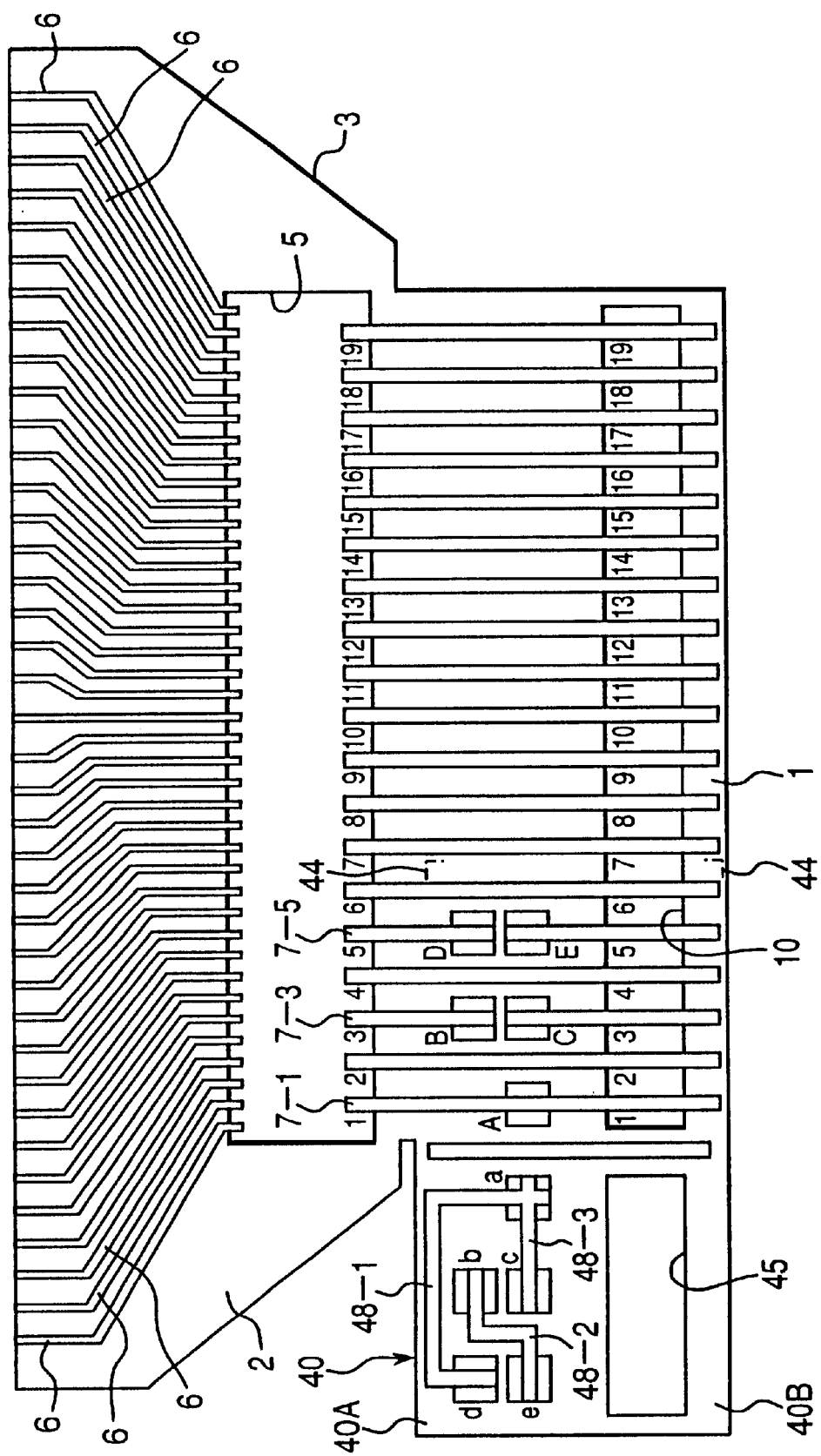
FIG. 5 shows a fifth embodiment of the tape carrier package according to the present invention.

Next, FIG. 5 shows a tape carrier package for liquid-crystal driving semiconductor devices, which is a fifth embodiment of the present invention.

This fifth embodiment is so designed that, in the third embodiment, out of the jut portions 40, 41 provided on both sides of the input-side lines 7, the one-side jut portion 41 is omitted and the cutoffs of the input-side main lines 7 opposed to this jut portion 41 as well as the solder-resist uncoated portions F, G, H, I, J are eliminated.

According to this fifth embodiment, a two-layer interconnection structure only by the one-side jut portion 40 can be formed.

(Sixth Embodiment)

Figure 6:
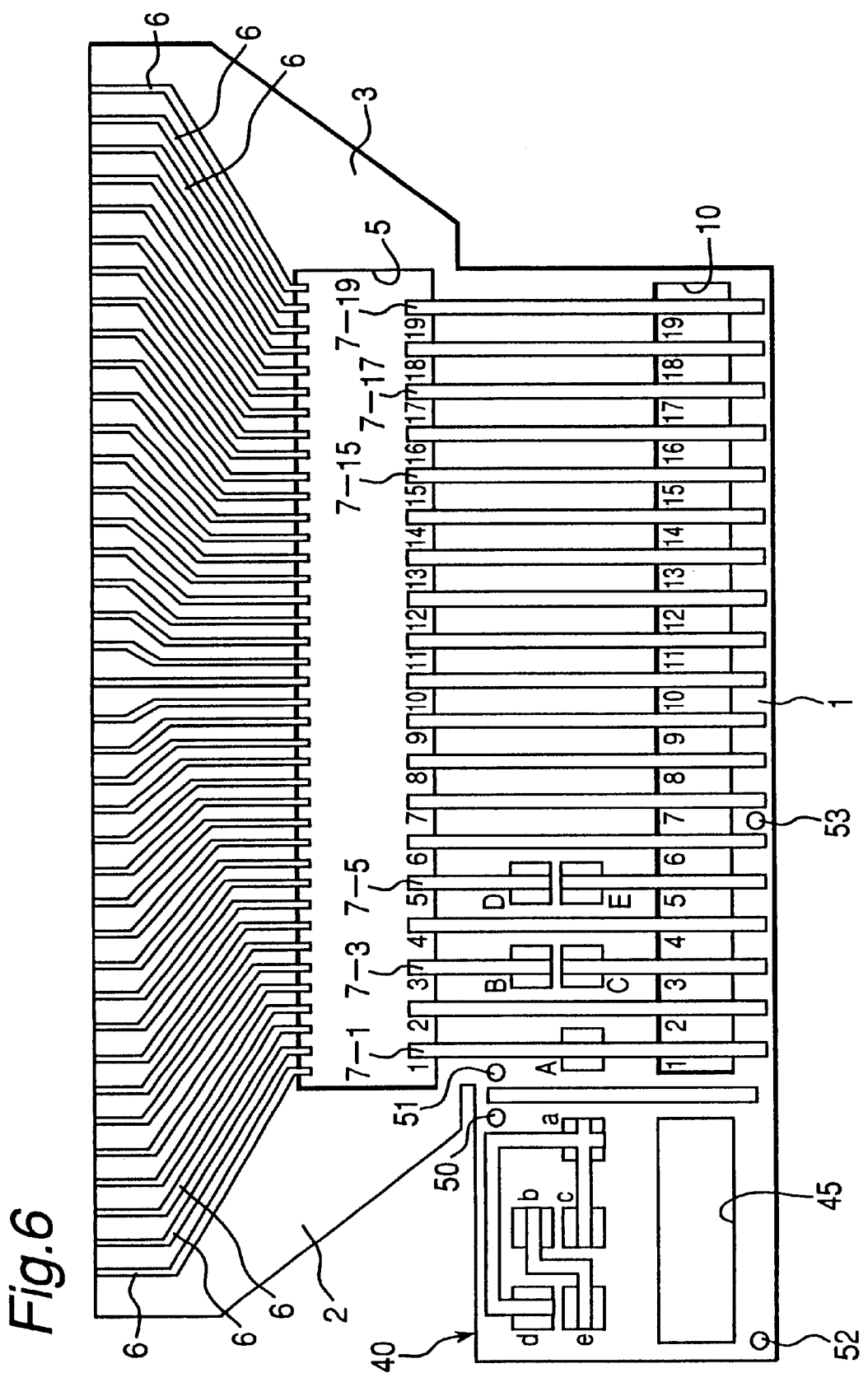
FIG. 6 shows a sixth embodiment of the tape carrier package according to the present invention.

Next, FIG. 6 shows a tape carrier package for liquid-crystal driving semiconductor devices, which is a sixth embodiment of the present invention.

This sixth embodiment is so designed that, in the fourth embodiment, out of the jut portions 40, 41 provided on both sides of the input-side lines 7, 7, 7 . . . , the one-side jut portion 41 is omitted and the cutoffs of the input-side main lines 7 opposed to this jut portion 41 as well as the solder-resist uncoated portions F, G, H, I, J are eliminated. According to this sixth embodiment, a two-layer interconnection structure only by the one-side jut portion 40 can be formed.

In addition, although the bending portions have been given as bending slits in the first to sixth embodiments, the bending portions may also be provided as other easy-to-bend forms such as perforations or thin-wall portions formed in the base material 3 instead of the bending slits.

Also, anisotropic conductive film has been used for electrical connection of the two-layer inter-connection structure in the first to sixth embodiments. However, since anisotropic conductive film is used also for the connection between the output-side lines and the transparent electrode of the liquid crystal panel, tools for thermocompression bonding can be shared in common, so that the anisotropic conductive film does not become a cause of any large cost increase.

Furthermore, whereas the connection between TCP and liquid crystal panel involves a narrower line pitch as well as a larger number of wiring lines, flexible boards have a difficulty in obtaining high precision because of their large expansion and contraction. Accordingly, although not shown, widening the pitch at the other ends 7β side of the input-side lines 7 facilitates the connection to the flexible boards, so that further downsizing in the future becomes feasible. Therefore, for liquid crystal modules, it becomes possible to obtain further lighter, thinner, shorter and smaller products and to reduce the cost. Thus, a liquid crystal panel module that just fits users' needs can be offered.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A tape carrier package on which a semiconductor device is to be mounted, comprising:

a base material; wiring lines formed on the base material; and an insulating top coat for insulating and protecting the wiring lines, wherein the wiring lines have a plurality of line exposed portions exposed from the insulating top coat, and at least one pair of line exposed portions, which are opposed to each other by bending the base material along a bending portion formed in the base material, are electrically connected to each other.

2. The tape carrier package according to claim 1, wherein the one pair of line exposed portions are electrically connected to each other by an anisotropic conductive film.

3. The tape carrier package according to claim 1, wherein bending alignment marks used in bending the base material are formed in the base material.

4. The tape carrier package according to claim 1, wherein the bending portion is provided so that, relative to main lines connected directly to the semiconductor device, the bending portion extends in adjacency to a direction in which the main lines are arrayed and along a direction in which the main lines extend.

5. The tape carrier package according to claim 1, wherein an input-connection slit by which the main lines connected directly to the semiconductor device are exposed are formed in the base material, and an input-connection hole which is to be laid on the input-connection slit when the base material is bent 180° along the bending portion is formed in the base material.

6. A liquid crystal module which uses the tape carrier package as defined in claim 1.

* * * * *